United States Patent
Bonaccio et al.

(10) Patent No.: US 6,452,448 B1
(45) Date of Patent: Sep. 17, 2002

(54) FAMILY OF ANALOG AMPLIFIER AND COMPARATOR CIRCUITS WITH BODY VOLTAGE CONTROL

(75) Inventors: Anthony R. Bonaccio, Shelburne, VT (US); Michel S. Michail, Poughkeepsie, NY (US); Wilbur D. Pricer, Charlotte; Steven J. Tanghe, Essex Junction, both of VT (US)

(73) Assignee: International Business Machines Corporation, Armonk, NY (US)

( * ) Notice: Subject to any disclaimer, the term of this patent is extended or adjusted under 35 U.S.C. 154(b) by 82 days.

(21) Appl. No.: 09/616,550

(22) Filed: Jul. 14, 2000

(51) Int. Cl.[7] .................................................. H03F 3/45
(52) U.S. Cl. ....................................... 330/253; 330/258
(58) Field of Search ................................. 330/253, 257, 330/258, 259, 260, 261

(56) References Cited

U.S. PATENT DOCUMENTS

| 4,184,124 A | * | 1/1980 | Asakawa | 330/264 |
| 5,646,900 A | * | 7/1997 | Tsukude et al. | 365/205 |
| 5,825,256 A | * | 10/1998 | Tchamov et al. | 331/113 R |
| 6,140,877 A | * | 10/2000 | Forbes | 330/258 |

* cited by examiner

Primary Examiner—Steven J. Mottola
(74) Attorney, Agent, or Firm—McGinn & Gibb, PLLC; Richard A. Henkler, Esq.

(57) ABSTRACT

A structure for an amplifier circuit which includes a pair of source-coupled differential transistors, each of source-coupled differential transistors having a body and a gate, and input transistors electrically connected to the source-coupled transistors. Also, the input transistors load the body and the gate of the source-coupled transistors with positive feedback signals. As a result, a differential gain is increased and a common mode gain is not increased. The output of the pair of source-coupled differential transistors is directed to second pair of transistors. The second pair of transistors generates mirrored voltages which track with input voltages. The second pair of transistors generates mirrored voltages translated by an offset voltage to values near ground, mirrored voltages which represent a voltage gain over an input voltage, and mirrored voltages which are largely differential and includes approximately no common mode input voltage.

24 Claims, 10 Drawing Sheets

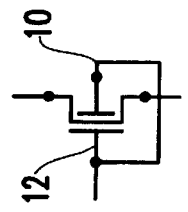
FIG.1A
FIG.1B
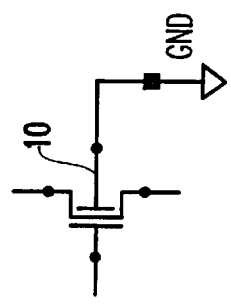
FIG.1C
FIG.1D
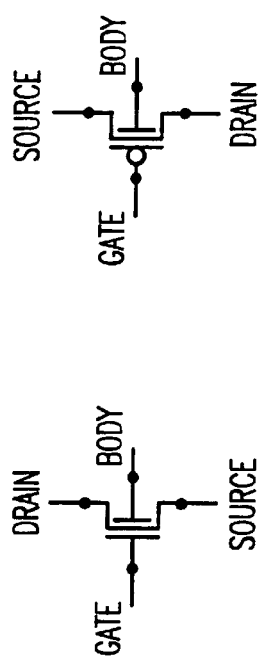
FIG.1E
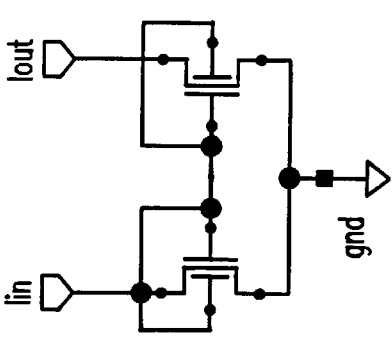
FIG.1F
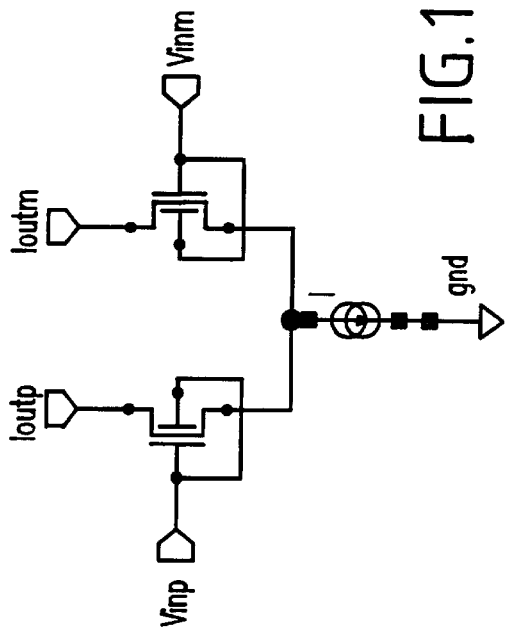

FAMILY OF ANALOG AMPLIFIER AND COMPARATOR CIRCUITS WITH BODY VOLTAGE CONTROL

BACKGROUND OF THE INVENTION

1. Field of the Invention

The present invention relates to amplifier circuits and more particularly to analog amplifier and comparator circuits with body voltage control.

2. Description of the Related Art

Silicon On Insulator (SOI) technology offers performance enhancements over bulk silicon technology for Complimentary Metal Oxide Semiconductor (CMOS) digital circuits. When properly designed, circuits implemented in SOI should exhibit a 20% to 30% performance advantage over the same circuit functions implemented in bulk silicon. Alternately, the performance can be exchanged for a factor of two reduction in power dissipation at the same operating frequency. Much of this performance gain is achieved by letting the body voltage float. This arrangement allows the body voltage to bootstrap during switching transients resulting in more rapid "turn on" characteristic in the switching transistors. SOI technology has been projected to cost about 10% more than bulk technology.

SOI technology would appear to be a poor choice for analog circuits. Most analog circuits require very close matching between the threshold characteristics of two or more transistors. Allowing the body voltage to float seriously erodes transistor matching. Matching can be restored by connecting the two transistor bodies to a common potential. This "solution" renders the performance advantage of SOI largely moot while retaining the larger processing costs.

Certain applications require both analog and digital circuits to be fabricated on the same chip and in the same technology. International Solid State Circuits Conference 1999 paper WP 25.6: "A SOI Specific PLL for 1 GHz Microprocessors" (incorporated herein by reference) is illustrative of the problems and limitations incurred when analog functions are forced into implementation with digital circuits in SOI technology. Therefore, there is a need for analog circuits to benefit from SOI technology.

SUMMARY OF THE INVENTION

It is, therefore, an object of the present invention to provide a structure for an amplifier circuit which includes transistors configured as a source-coupled differential pair and whose bodies are controlled with a scaled and shifted version of the input voltage using positive feedback.

The invention further includes at least two more sets of two transistors comprising current mirrors, wherein an output current from the pair of source-coupled differential transistors is directed to the two current mirrors. The current mirrors generate currents proportional to the input voltage. The currents from the two current mirrors are driven into a fourth set of diode-connected transistors configured as loads. The voltage produced by the fourth set of transistors is applied differentially to the body node on the first set of transistors as a positive feedback voltage. In this way the positive feedback voltage is a translated and scaled version of the input signal voltage applied to the first set of devices.

Another embodiment of the of the invention is an amplifier circuit including at least two complimentary pairs of source-coupled differential pairs of transistors, the source-coupled differential pairs of transistors including a body and a gate, and at least two diode connected field effect transistors connected to each of said complimentary pairs. The diode connected field effect transistors load the body and the gate of the pair of transistors with positive feedback signals.

BRIEF DESCRIPTION OF THE DRAWINGS

The foregoing and other objects, aspects and advantages will be better understood from the following detailed description of a preferred embodiment of the invention with reference to the drawings, in which:

FIG. 1a is a schematic diagram of an n-channel SOI field effecting transistors (FET);

FIG. 1b is a schematic diagram of p-channel SOI FET;

FIG. 1c is a schematic diagram of a body electrode wired to ground;

FIG. 1d is a schematic diagram of a body electrode connected to the gate electrode;

FIG. 1e is a schematic diagram of a two n-channel transistors wired as a current mirror;

FIG. 1f is a schematic diagram of a source coupled differential pair.

DETAILED DESCRIPTION OF PREFERRED EMBODIMENTS OF THE INVENTION

The invention will be explained, in a step by step fashion, from another well known amplifier commonly configured in bulk (non-SOI) technology.

FIGS. 1a and 1b are schematic diagrams of n-channel and p-channel SOI FETs. SOI transistors are self contained within a pocket of insulating walls, and therefore, the SOI transistors have a body which is not joined to the substrate. This body can be treated like an independent electrode, or it can be externally wired to any of the other three electrodes (e.g., the body electrode could be wired to ground as in FIG. 1c). In this configuration, the SOI transistor behaves very much like a bulk transistor in a common substrate, and does not exhibit the "kink" effect or any other floating body effects so troublesome to conventional SOI analog circuits. However, it also doesn't exhibit any performance improvement. Thus, the price of SOI technology is paid without achieving any advantage.

FIG. 1d shows the body electrode 10 connected to the gate electrode 12. In this configuration, given the proper operating voltages, the SOI transistor can achieve a sharper turn on characteristic and higher transconductance for any given gate (and body) voltage. The operating proper voltages, however, are severely limited. If the body voltage becomes 0.6 or 0.7 volts greater than the source or the drain, a junction diode (not shown) is forward biased and large undesirable currents will flow into the circuit.

FIG. 1e shows two n-channel transistors wired as a simple current mirror. This configuration is easy to implement without forward biasing the body to channel diode (not shown). FIG. 1f shows two n-channel transistors 2 wired as a differential pair, as the transistors may be used at the input to an operational amplifier. The inputs, Vinp and Vinm, are tied to the gates and bodies of the transistors. In this configuration, if the input voltages are not restricted, the body to drain or body to source junctions could become forward biased. In this NFET example, the body is doped p-type and the source and drain are doped n-type. Thus, if the body voltage exceeds the drain or source voltage by more than a diode turn-on voltage (about 0.65V), these junctions will conduct current, which is undesirable. This forward biasing is avoided in the invention.

Figure 2:
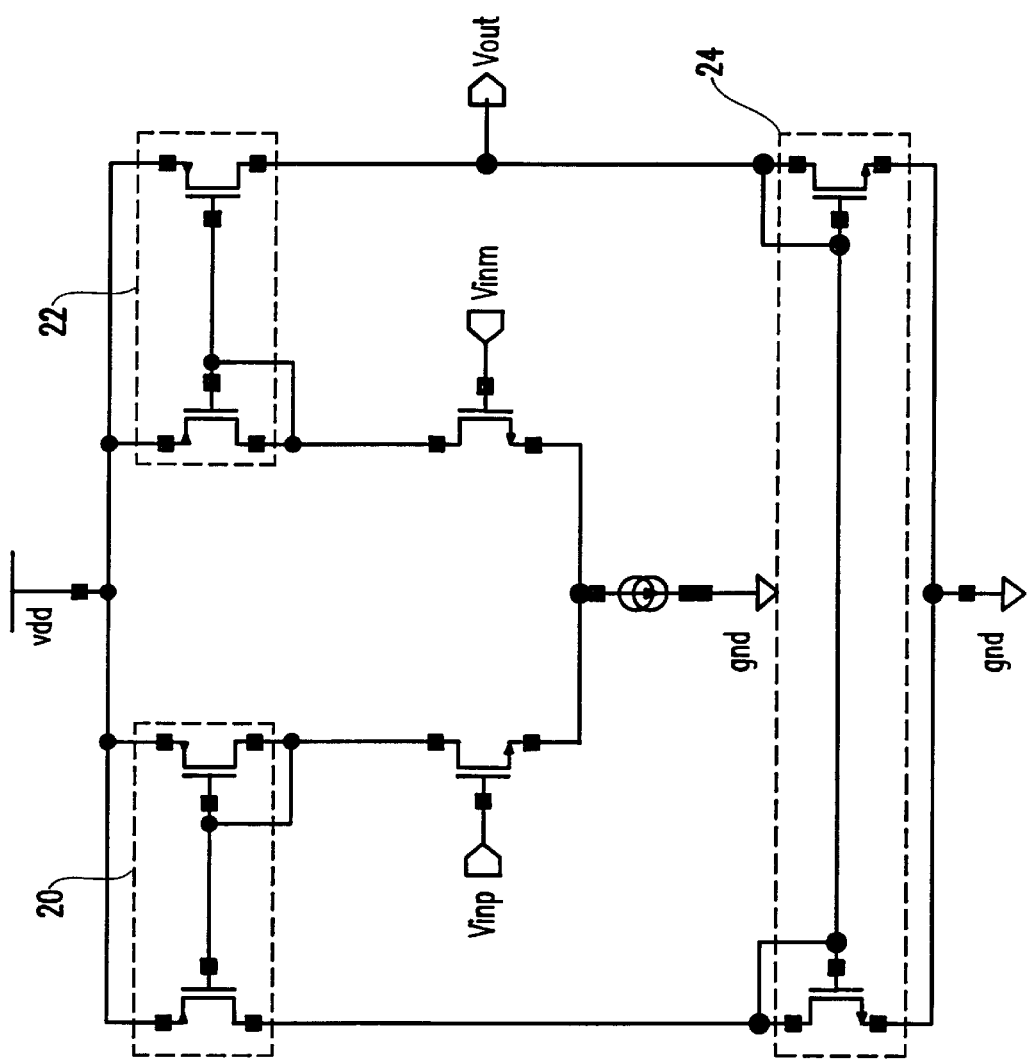
FIG. 2 is a schematic diagram of an amplifier circuit.

FIG. 2 depicts an amplifier sometimes implemented in bulk technology. This amplifier has a large number of current mirror transistors 20, 22, and 24, and therefore, serves as a promising starting point for the invention.

Figure 3:
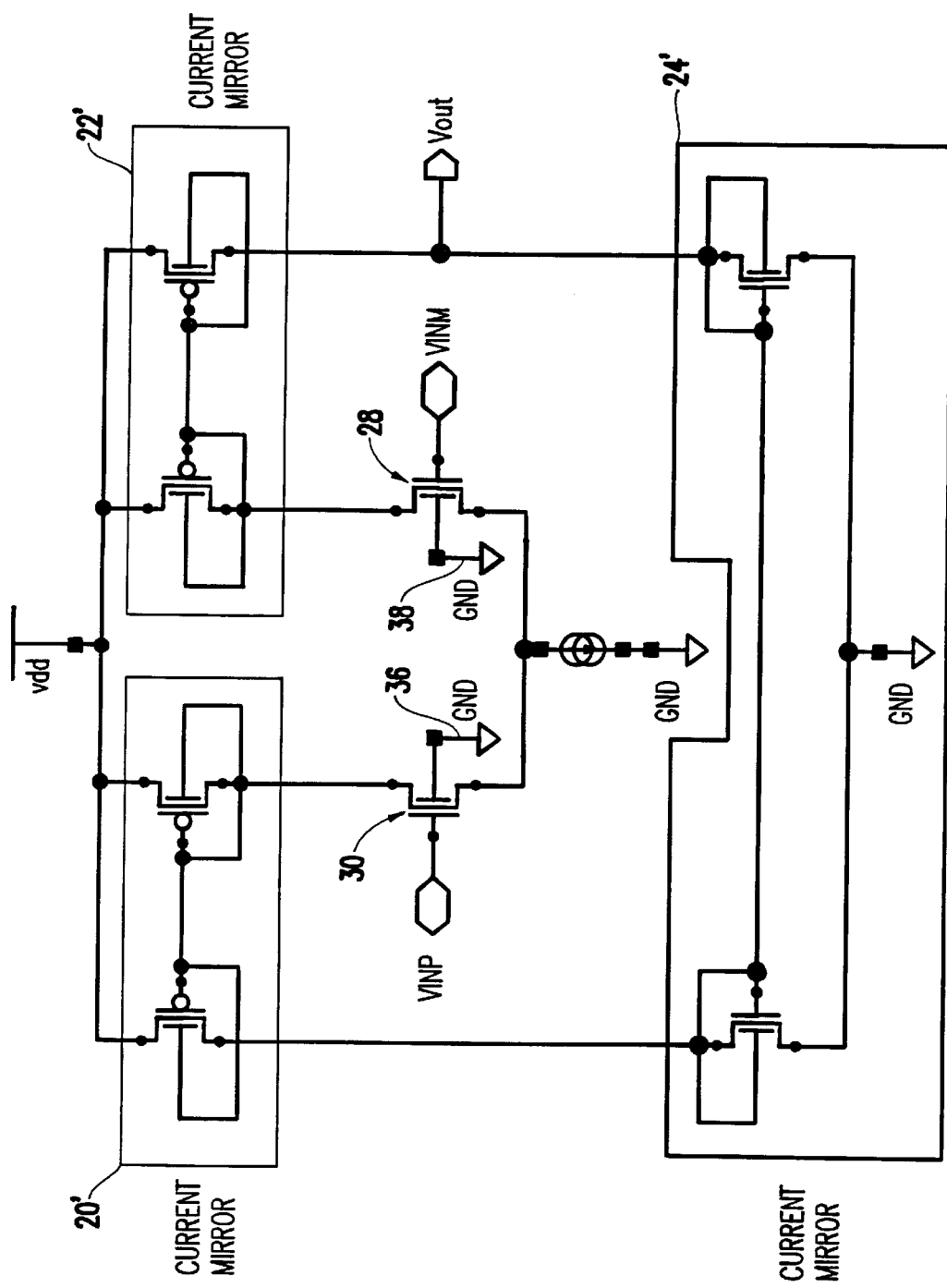
FIG. 3 is a schematic diagram of the amplifier circuit as in FIG. 2, but all current mirror transistors are converted to common body/gate electrodes.

FIG. 3 shows the same circuit as FIG. 2, but all current mirror transistors 20, 22, and 24 are converted to common body/gate electrodes 20', 22', and 24'. The input transistors 28, 30 however, have been left with their bodies tied to ground 36, 38 to avoid the aforementioned forward biased diode problem.

The gain of these input transistors could be greatly enhanced if the input voltage could be brought to the body translated by some suitable offset voltage that would avoid forward biasing the diode. The current mirrors (FIG. 1e) provide just this opportunity.

Figure 4:
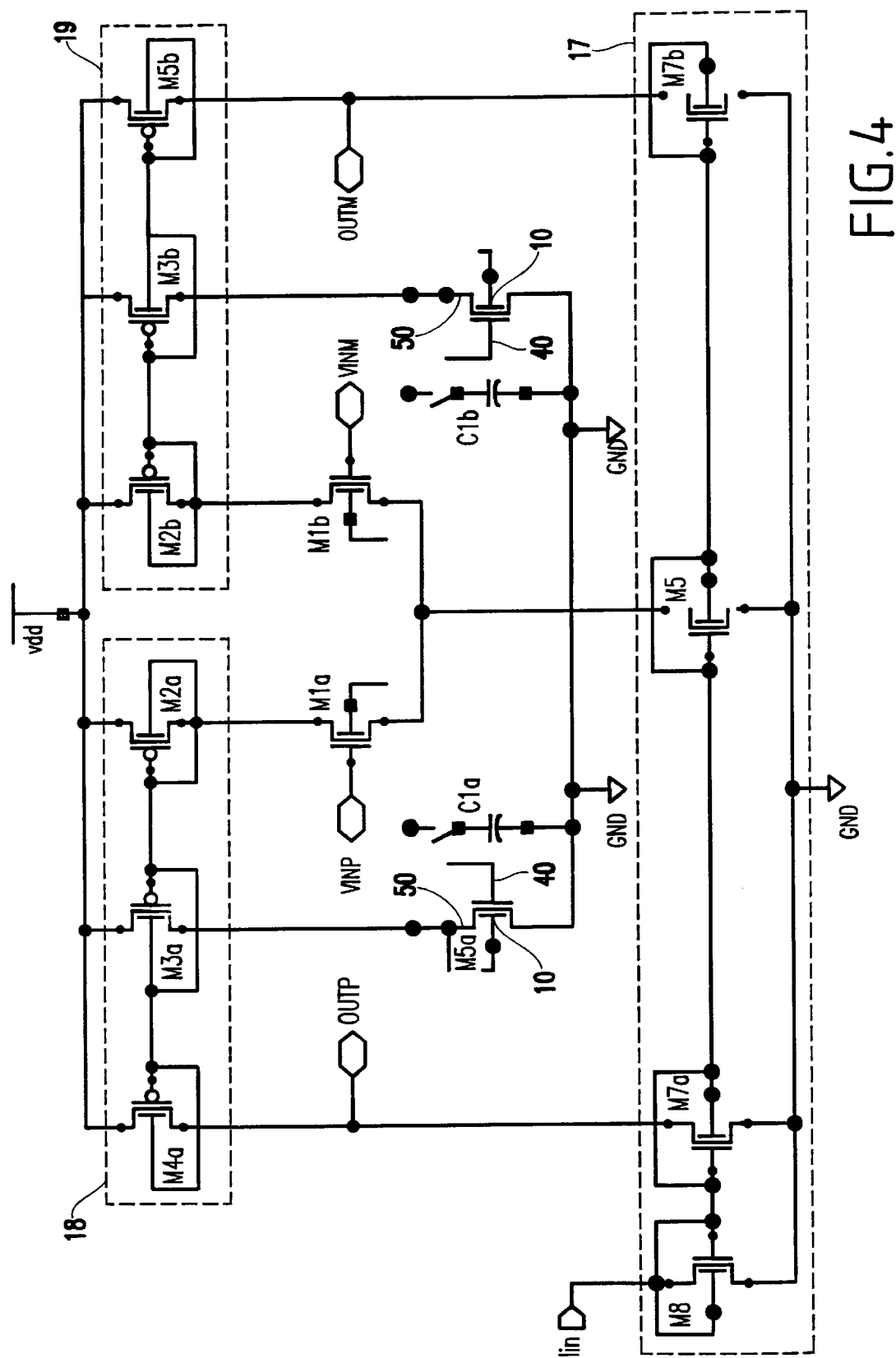
FIG. 4 is a schematic diagram of the first embodiment of the invention.

FIG. 4 shows one embodiment of the invention, which has been extended to have a fully differential output. Current mirrors 18, 19 comprised of transistors M2a, M3a and M4a and M2b, M3b and M4b, receive the differential input currents from input transistors M1a and M1b. Mirrored currents are directed to transistors M5a and M5b. Both transistors M5a and M5b have a body 10 shorted to gate 40 and drain 50. Transistors, M7a, M6 and M7b form current mirror 17 and each scale and replicate the currents from transistor M8.

Transistors M5a and M5b generate mirrored voltages which track the input voltages but with three important differences. First, the mirrored voltages are translated by an offset voltage to values near ground. This occurs because input devices M1a and M1b produce differential currents that represent the signal voltage. This current signal gets mirrored to the load devices M5a and M5b by mirrors 18 and 19. Since the load devices are connected to ground, they develop a signal voltage that is close to the ground.

Second, the mirrored voltages may represent a voltage gain over the input. The gain comes from scaling the devices in the current mirrors 18 and 19 or by scaling the load devices M5a and M5b. In both cases, modifying the size of the transistors can either increase or decrease the mirrored voltage relative to the input voltage.

Third, the mirrored voltages are largely differential, retaining only a remnant of the common mode input voltage. The common mode component of the signal is mostly removed from the signal by the differential pair, which primarily modifies the differential component of the signal while suppressing the common mode component.

Thus, the invention feeds a scaled and shifted version of the input voltage into the body terminals of the input pairs of transistors. This feedback signal, as will be shown, enhances the gain of the amplifier. Thus, the body terminal inherent in the SOI devices is used to an advantage in analog circuits.

Additional data is provided to help the reader better understand this circuit's operation. The circuit of FIG. 4 has been provided to help qualitatively demonstrate the power of the invention. Capacitors C 1a, and C 1b are large capacitors that are used for simulation purposes only. When switched in, they effectively provide an ac ground to the bodies of M1a and M1b (but allow correct dc biasing). This provides a convenient method to compare the performance of this amplifier with and without feedback applied to the body terminals of the input devices.

Forward biasing the diodes in the input differential pair has been avoided by directing their drain currents to the inputs of two p-channel current mirrors. The current mirrors restrict drain voltages to values near Vdd. Likewise, the action of the current mirrors M2a/M3a and M2b/M3b, in conjunction with diode connected transistors M5a and M5b, restrict the body voltage of each input device to voltages near ground.

Differential gain is enhanced by feeding the input signal to both the gate and the body, which acts like a second gate. Although the differential gain is increased, the common mode gain is net. This is because the common mode input voltage of the signal has been largely removed from the signal which is fed to the bodies.

In this configuration input pair devices, M1a and M1b, drive a current into a low impedance node formed by current mirrors 18 and 19. Thus, the drains of M1a and M1b do not move much in voltage. Furthermore, the body nodes of M1a and M1b are limited to signals near ground. The limited swings on these nodes contribute to high dynamic range on the amplifier. The input devices remain saturated for a large range of input voltages.

It should be noted that, as with many fully differential amplifiers, the output common mode voltage can be controlled to a level independent of the input common mode voltage. This is typically done with an auxiliary circuit as would be known to one ordinarily skilled in the art, given this disclosure.

Figure 5:
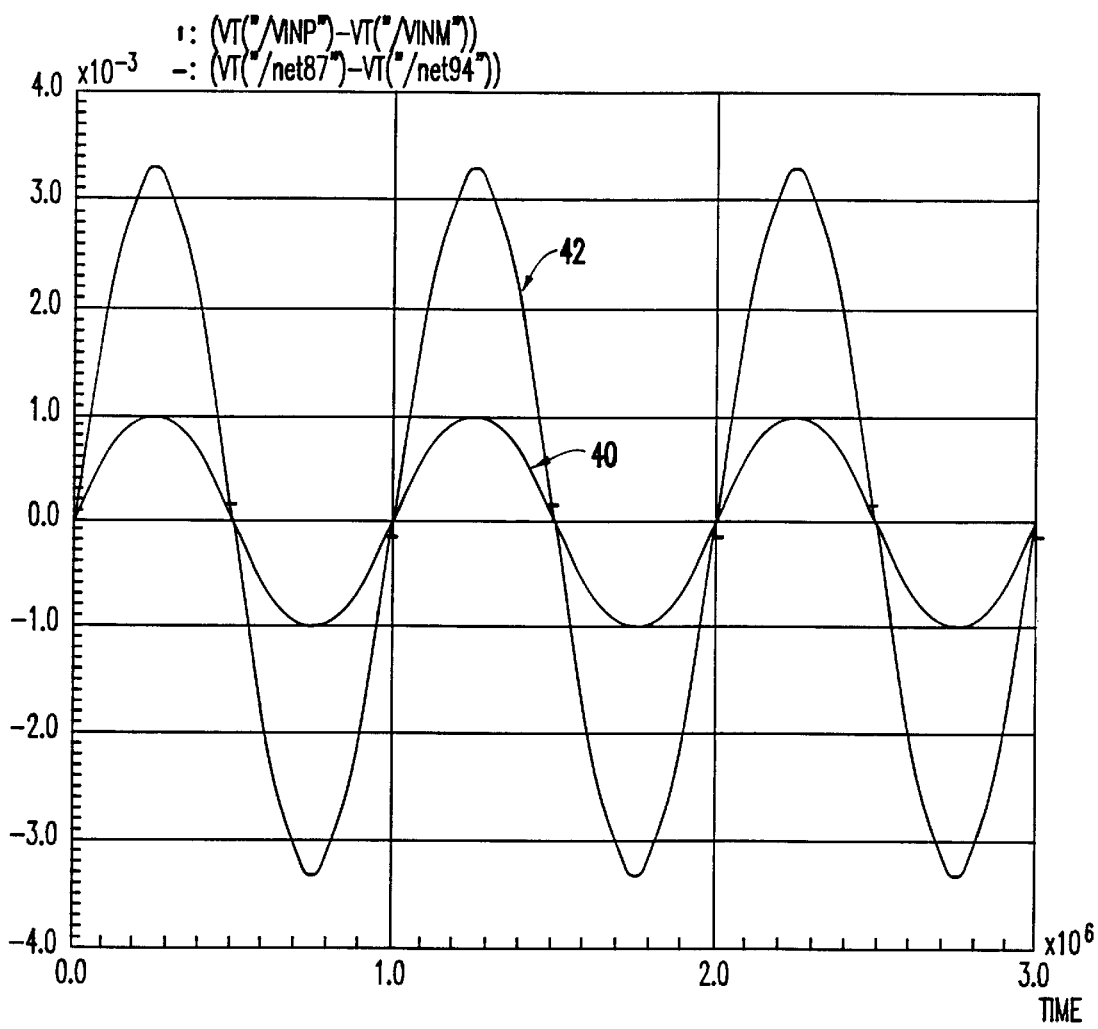
FIG. 5 is a schematic diagram of the feedback signal to M1a and M1b.

FIG. 5 depicts the feedback signal 42 from a differential input voltage, which is applied to the bodies of M1a and M1b of the embodiment in FIG. 4. The feed back signal 42 is approximately 3X the differential input signal 40. More specifically, time is shown along the horizontal axis and voltage is shown along the vertical axis.

Figure 6:
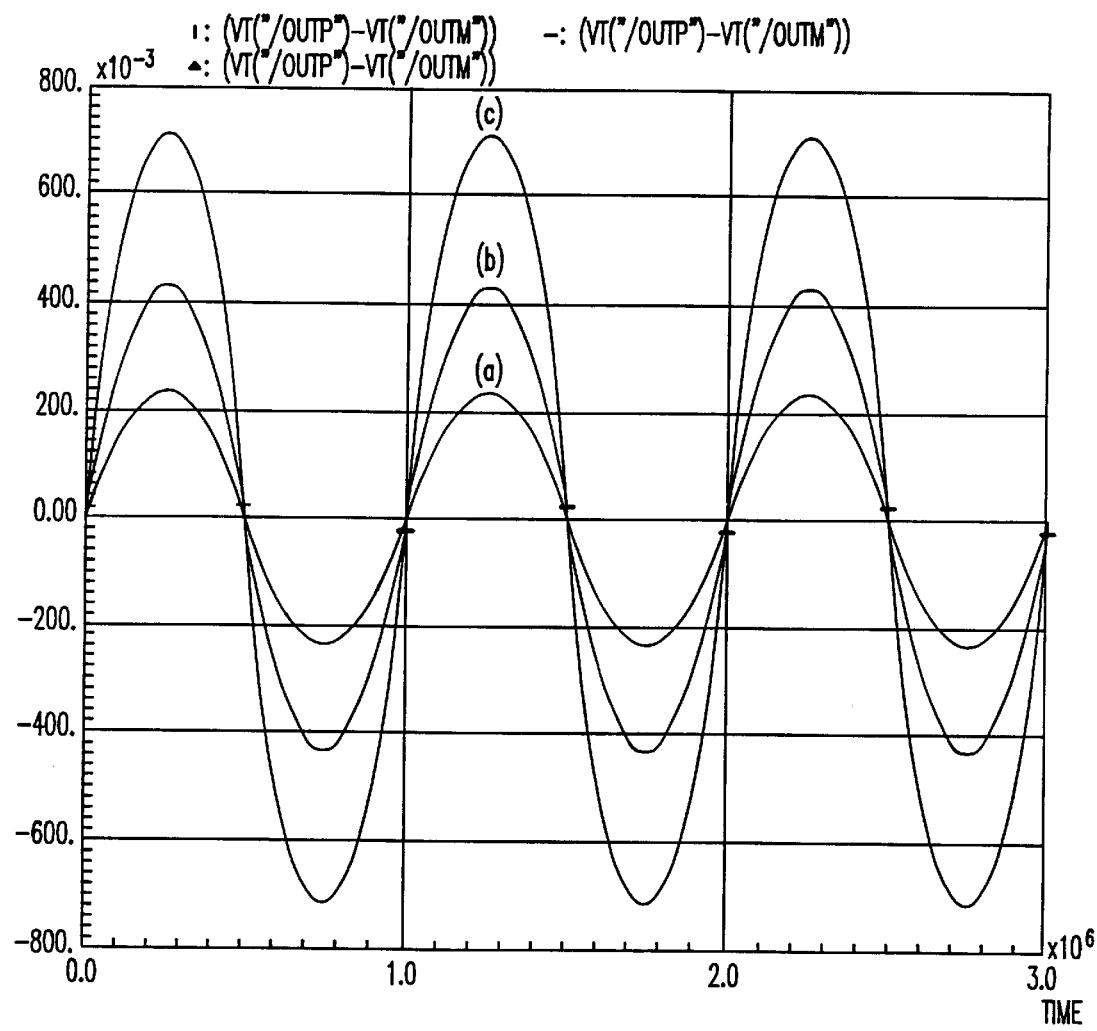
FIG. 6 is a schematic diagram of the differential gain with and without signal feedback to the bodies (curves (a) and (b), respectively).

FIG. 6 is a time verses voltage plot which depicts the differential output voltage differential gain with and without signal feedback to the bodies, a and b, respectively. The differential gain is enhanced about 1.9× by connecting the body feedback. More specifically, FIG. 6 shows output voltages produced when the input to the embodiment in FIG. 4 is a sine wave with 1 mV amplitude.

Figure 7:
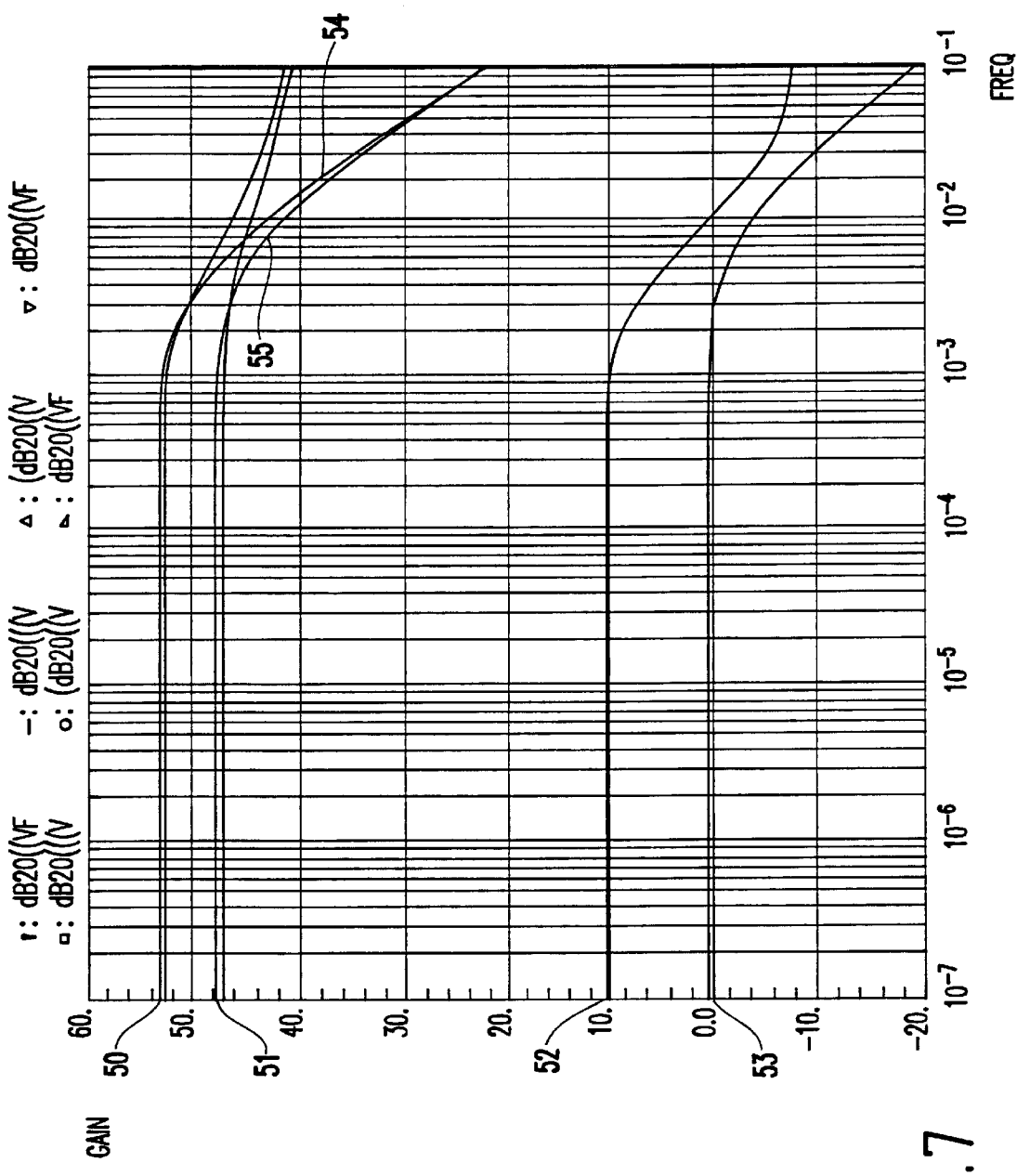
FIG. 7 is a schematic diagram of a plot of the gain verses frequency.

FIG. 7 is a frequency verses gain plot for the embodiment of FIG. 4 and depicts the differential mode gain with and without body signal 50 and 51, respectively; and common mode gain with and without body signal, 52 and 53 respectively. The common mode rejection ratio (CMRR) can be calculated and is the absolute value of ratio of the differential mode gain with body signal, Adm, to the common made gain without body signal, Ac. More specifically, FIG. 7 depicts CMRR for feedback with body signal 55 and the CMRR for feedback without body signal.

The differential gain of the amplifier is calculated below. If the output resistance on the drain of a FET in saturation is much larger than the transresistance (normally the case), the differential gain of the circuit in FIG. 4 can be estimated as:

$$A_{dm} := \frac{M_{24^*} Z_o \cdot gm_1}{1 - M_{23^*} Z_B \cdot gmb_1} \quad (1)$$

where $M_{24}$ is the current gain due to current mirror M2:M4; $M_{23}$ is the current gain due to current mirror M2:M3; $gm_1$ is the top gate transconductance of M1*a*, M1*b*; $gmb_1$ is the body effect transconductance of M1*a*, M1*b*; $Z_O$ is the load impedance at the circuit output OUTP, OUTM; $Z_B$ is the load impedance that drives the body terminal on M1*a*, M1*b*;

In the case of FIG. 4, $Z_B$ is the impedance looking into the diode connected FET, M5, and is:

$$Z_B := \frac{1}{gm_5 + gmb_5} \quad (2)$$

where $gm_5$ is the top gate transconductance of M5*a*, M5*b*, $gmb_5$ is the body effect transconductance of M5*a*, M5*b* and thus Eq. 1. Becomes:

$$A_{dm} := \frac{M_{24^*} Z_0 \cdot gm_1}{1 - \frac{M_{23} \cdot gmb_1}{gm_5 + gmb_5}} \quad (3)$$

This result can be compared to the gain of the circuit with no active feedback applied to the bodies of the input devices, M1*a* and M1*b*.

$$A_{dm}(\text{no FB}) := M_{24^*} Z_0 \cdot gm_1 \quad (4)$$

The gain improvement in using active feedback to the body is quantitatively represented by dividing Eq. 1 by Eq. 4, giving:

$$\frac{A_{dm}}{A_{dm(noFB)}} := \frac{1}{1 - M_{23^*} Z_B \cdot gmb_1} \quad (5)$$

In the circuit of FIG. 4, and for the results that have been presented for it, these numbers are fairly typical at:

$$M_{23} := 10 Z_B := 800 \bullet ohm$$

$$gmb1 := 60 \cdot \frac{\mu A}{V}$$

And from (5) this gives a gain improvement of 1.92.

Figure 8:
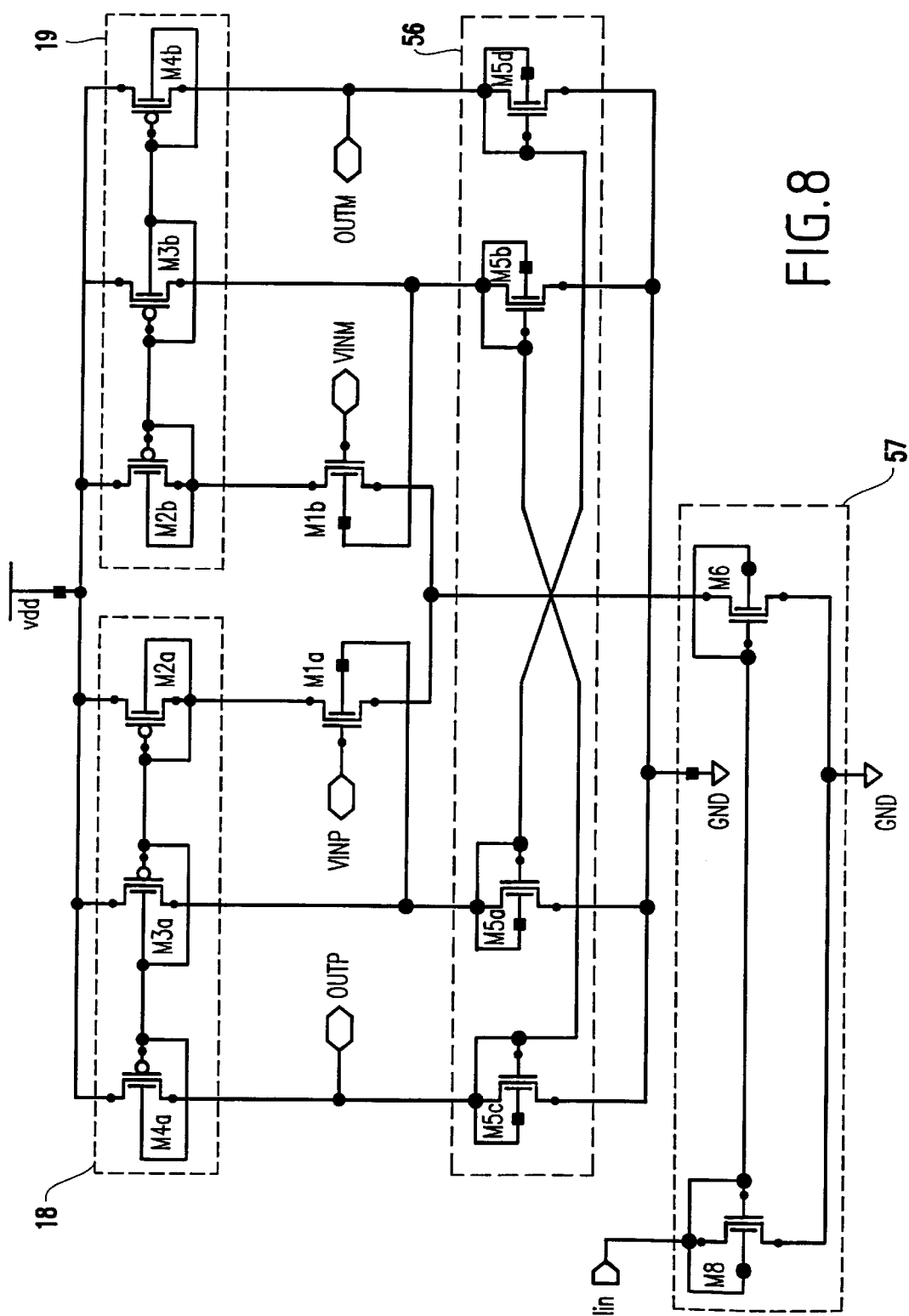
FIG. 8 is a schematic diagram of a second embodiment of the invention with a push pull output current drive.

Referring now to FIG. 8, another embodiment of the invention is illustrated. More specifically, the embodiment in FIG. 8 further increases the amplifier gain by making the output current drive push pull. That is, the output signal is driven from the top and the bottom of the outputs, OUTM, and OUTP, effectively doubling the gain. The signal is "wrapped" around to the bottom via new current mirrors consisting of M5*b* and M5*c* as well as M5*a* and M5*d*. The voltage signal to the bodies of transistors M1*a* and M1*b* has also been used in a complementary output mirror 56. FIG. 6 shows the output voltage (c) for the amplifier of FIG. 8. By comparing this result to curve (b), taken from the circuit in FIG. 4, the gain has improved by making the connections described above because the output current drive is now push pull. This gain increase is a function of the current mirror ratios used in the amplifier.

The inventive circuit can be used alone or as the input stage to a high gain operational amplifier. In the previous example, the modest voltage gain to the body electrodes was selected appropriate to an operational amplifier. However, as would be known by one ordinarily skilled in the art, comparator like gain characteristics can be obtained by merely selecting higher values. This will produce a sharp threshold like characteristic to the gain. Therefore, the invention is easily expandable to a family of comparator circuits which are identical in schematic to the amplifier figures of this disclosure which differ only in the amount of gain applied to body electrodes.

Figure 9:
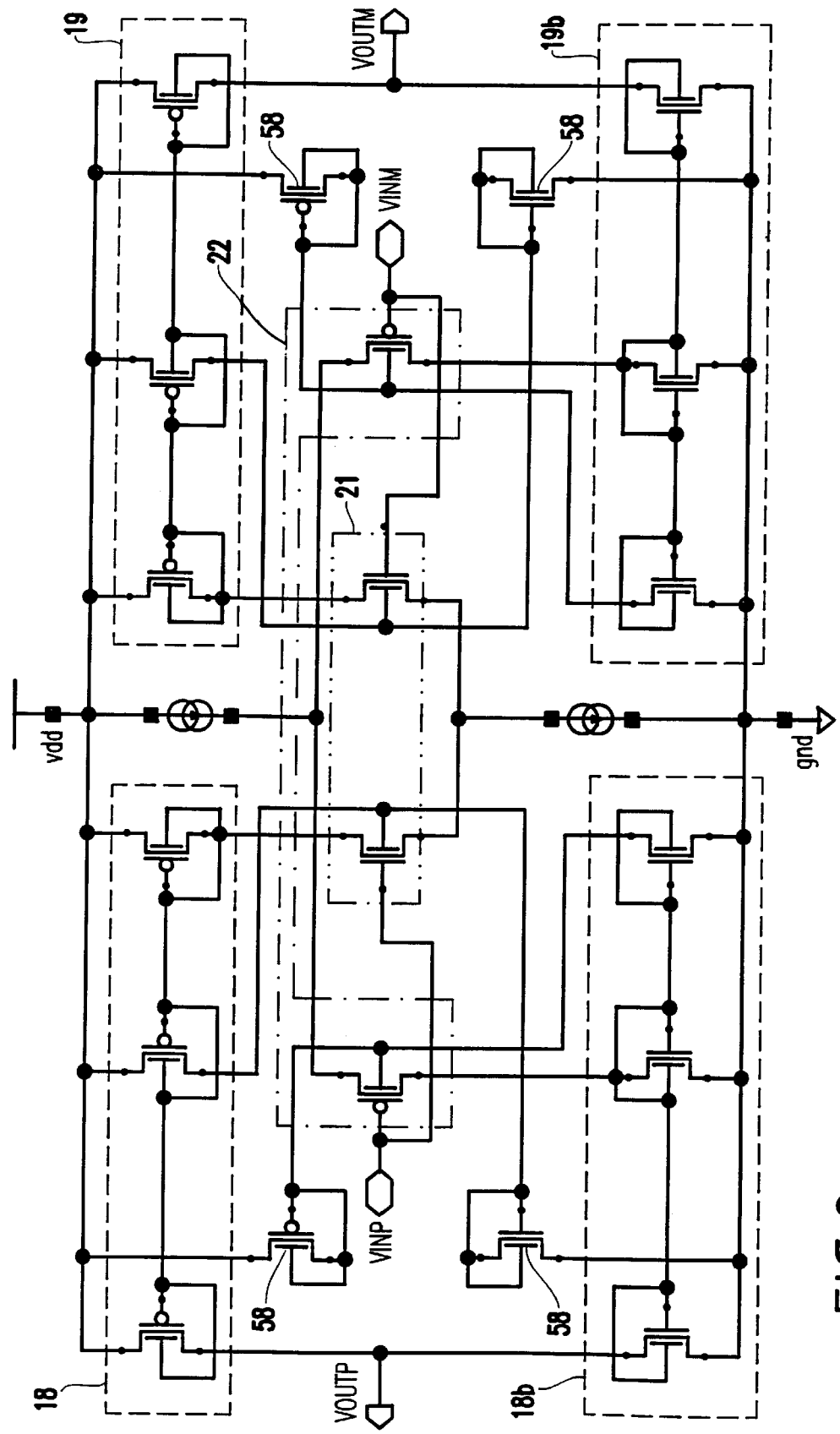
FIG. 9 is a schematic diagram of a third embodiment of the invention which develops the body voltages individually by feeding one arm of each of the four current mirrors to a diode connected FET.
Figure 10:
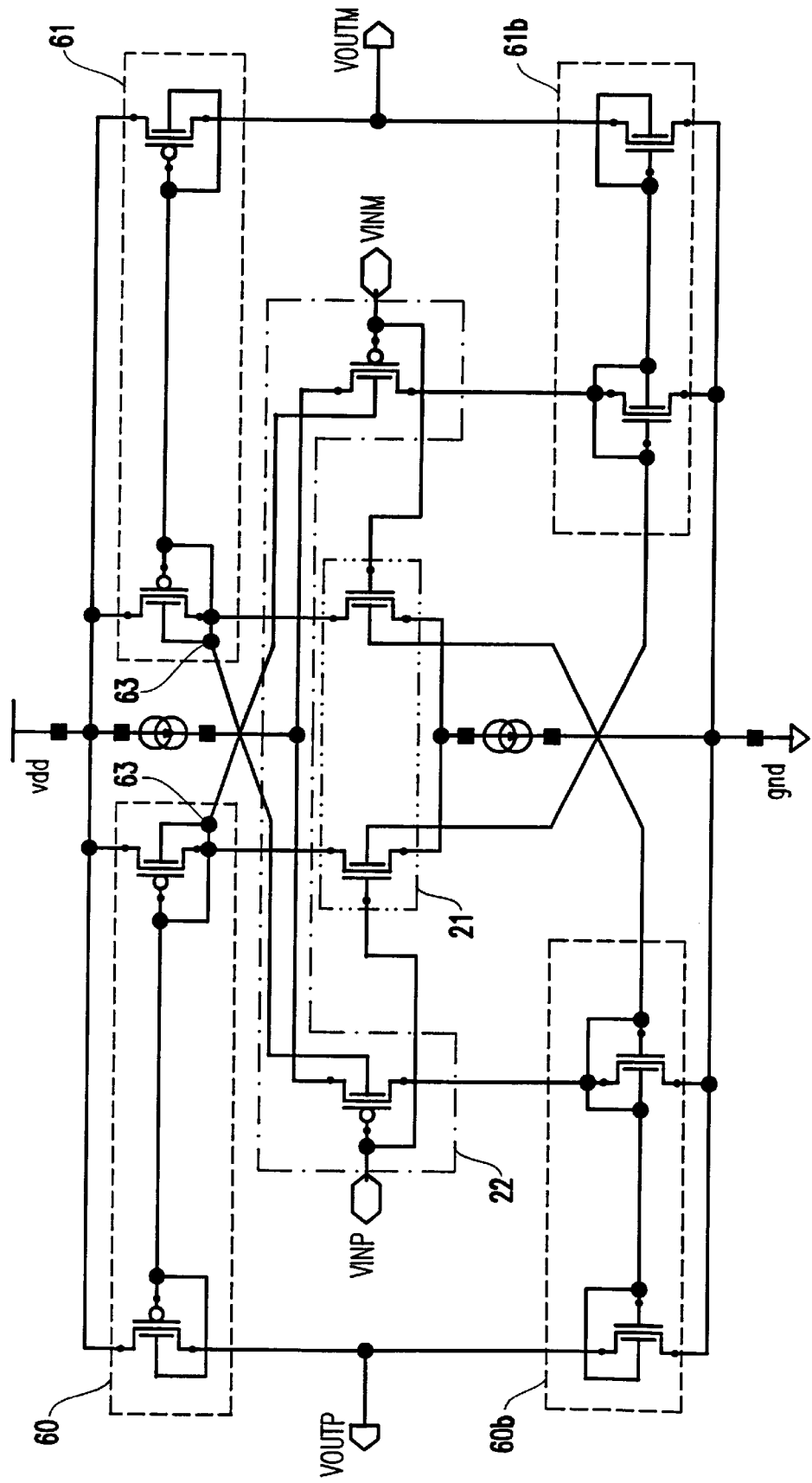
FIG. 10 is a schematic diagram of a fourth embodiment in which the body voltage has been found at a convenient pre-existing node.

FIGS. 9 and 10 show two additional embodiments of the invention. All previous figures have depicted the invention using a single differential pair (which may be either n or p-channel) of transistors where the input dynamic range is more than sufficient for most applications. As shown in FIG. 9, the input dynamic range can be extended to very near both power supply rails by using two (complementary) differential pairs 21 and 22. If the common mode voltage of the input signal is close to the power supply voltage, vdd, the differential pair consisting of PFETs 22 will cease operation but the NFET differential pair 21 will continue to operate. The opposite of this is true if the common mode voltage of the input is near ground. Thus, the input voltage range is increased (input dynamic range) by using two complimentary differential pairs of transistors. The body voltages are developed individually by feeding one arm of each of the four current mirrors 18, 18*b*, 19 and 19*b* to diode connected FETs 58. There are four diode connected FETs 58, positioned near the four comers of the circuit.

FIG. 10 is an economy version of the circuit shown in FIG. 9. Similar to the embodiment in FIG. 9, complimentary differential input pairs 21 and 22 are utilized. Also, the four FETs 58 are not needed because the body voltage has been found at a convenient pre-existing node 63. The elimination of the four FETs 58 results in a cost savings in the manufacture of the invention because less materials and processing steps are required to assemble the circuitry.

Now, unlike the conventional amplifier of FIG. 1, which is configured in bulk (non-SOI) technology, the invention, as shown in FIG. 4, forms analog amplifier and comparator circuits coupled with SOI technology and with positive feedback applied to the body nodes on the input devices, thereby increasing the gain. The invention provides an increase in the differential gain to approximately 1.9× the differential gain in circuits without body control.

The invention also provides a further increase in the gain by making the output of the current drive push pull. In addition, as shown in FIGS. 9 and 10, the invention provides for an extension in the input dynamic range by using two complimentary source-coupled differential pairs of input transistors 21 and 22. Further, the invention in FIG. 10 eliminates the need for the individual FETs 58 and depicts an economy version of the invention in FIG. 9.

While the invention has been described in terms of preferred embodiments, those skilled in the art will recognize that the invention can be practiced with modification within the spirit and scope of the appended claims.

What is claimed is:

1. An amplifier circuit comprising:
    a first pair of source-coupled differential transistors, each of said source-coupled differential transistors having a body and a gate, wherein a differential input signal voltage is applied to said gate of said source-coupled differential transistors; and
    a second set of load devices connected to said body of said source-coupled differential transistors, wherein said load devices provide a positive feedback signal to said source-coupled differential transistors, wherein said positive feedback signal increases a differential gain of said source-coupled differential transistors.

2. The amplifier circuit of claim 1, further comprising a third pair of transistors connected to said source-coupled transistors, wherein an output current of said source-coupled transistors is directed to said third pair of transistors.

3. An amplifier circuit comprising:
a first pair of source-coupled differential transistors, each of said source-coupled differential transistors having a body and a gate, wherein a differential input signal voltage is applied to said gate of said source-coupled differential transistors;
a second set of load devices connected to said body of said source-coupled differential transistors, wherein said load devices provide a positive feedback signal to said source-coupled differential transistors; and
a third pair of transistors connected to said source-coupled transistors, wherein an output current of said source-coupled transistors is directed to said third pair of transistors,
wherein said third pair of transistors generate mirrored currents from said source-coupled transistors and direct said mirrored current to said load devices, thereby producing a positive feedback voltage to said body of said source coupled differential transistors.

4. The amplifier circuit of claim 1, wherein said load devices produce feedback voltages that have a common mode voltage translation from said differential input signal voltage applied to said gates of said source-coupled differential transistors.

5. The amplifier circuit of claim 1, wherein said load devices produce feedback voltages that represent a voltage gain over the said differential input signal voltage applied to the said gate of said source-coupled differential transistors.

6. The amplifier circuit of claim 1, wherein said load devices produce feedback voltages that are proportional to said differential input signal voltages and have an attenuated common mode signal content.

7. An amplifier circuit comprising:
at least two complementary first pairs of source-coupled differential transistors, each of said source-coupled differential transistor having a body and a gate, wherein a differential input signal voltage is applied to said gate of said source-coupled differential transistors; and
a second set of load devices connected to said body of each of said source-coupled differential transistors, wherein said load devices provide a positive feedback signal to said source-coupled differential transistors.

8. The amplifier circuit of claim 7, wherein said positive feedback signal increases a differential gain of said source-coupled differential transistors.

9. The amplifier circuit of claim 7, further comprising a third pair of transistors connected to said source-coupled transistors, wherein an output current of said source-coupled transistors is directed to said third pair of transistors.

10. The amplifier circuit of claim 9, wherein said third pair of transistors generate mirrored currents from said source-coupled transistors and direct said mirrored current to said load devices, thereby producing a positive feedback voltage to said body said source-coupled differential transistors.

11. The amplifier circuit of claim 7, wherein said load devices produce feedback voltages that have a common mode voltage translation from said differential input signal voltage applied to said gate of said source-coupled differential transistors.

12. The amplifier circuit of claim 7, wherein said load devices produce feedback voltages that represent a voltage gain over the said differential input signal voltage applied to the said gate of said source-coupled differential transistors.

13. The amplifier circuit of claim 7, wherein said load devices produce feedback voltages that are proportional to said differential input signal voltages and have attenuated common mode signal content.

14. The amplifier circuit of claim 7, wherein said differential input signal comprises a common mode voltage range which is extended to near a power supply rail for each of said complimentary pair of source-coupled differential transistors.

15. The amplifier circuit of claim 7, wherein said load devices permit individual control of said positive feedback signal to each of said pairs of source-coupled differential transistors.

16. An amplifier circuit comprising:
at least two complementary first pairs of source-coupled differential transistors, each of said source-coupled differential transistor having abody and a gate, wherein a differential input signal voltage is applied to said gate of said source-coupled differential transistors; and
at least two diode connected field effect transistors connected to each of said body of said source-coupled differential transistors, wherein said load devices provide a positive feedback signal to said source-coupled differential transistors.

17. The amplifier circuit of claim 16, wherein said positive feedback signal increases a differential gain of said source-coupled differential transistors.

18. The amplifier circuit of claim 16, further comprising a third pair of transistors connected to said source-coupled transistors, wherein an output current of said source-coupled transistors is directed to said third pair of transistors.

19. The amplifier circuit of claim 18, wherein said third pair of transistors generate mirrored currents from said source-coupled transistors and direct said mirrored current to said diode connected field effecting transistors, thereby producing a positive feedback voltage to said body said source-coupled differential transistors.

20. The amplifier circuit of claim 16, wherein said diode connected field effecting transistors produce feedback voltages that have a common mode voltage translation from said differential input signal voltage applied to said gate of said source-coupled differential transistors.

21. The amplifier circuit of claim 16, wherein said diode connected field effecting transistors produce feedback voltages that represent a voltage gain over the said differential input signal voltage applied to the said gate of said source-coupled differential transistors.

22. The amplifier circuit of claim 16, wherein said diode connected field effecting transistors produce feedback voltages that are proportional to said differential input signal voltages and have attenuated common mode signal content.

23. The amplifier circuit of claim 16, wherein said differential input signal comprises a common mode range which is extended to near a power supply rail for each of said complimentary pair of source-coupled differential transistors.

24. The amplifier circuit of claim 16, wherein said diode connected field effecting transistors permit individual control of said positive feedback signal to each of said pairs of source-coupled differential transistors.

* * * * *